(12) United States Patent
Chou et al.

(10) Patent No.: US 10,088,761 B1
(45) Date of Patent: Oct. 2, 2018

(54) LITHOGRAPHY DEVICE AND APPARATUS AND METHOD FOR LITHOGRAPHY DEVICE

(71) Applicant: TAIWAN SEMICONDUCTOR MANUFACTURING CO., LTD., Hsinchu (TW)

(72) Inventors: You-Hua Chou, Hsinchu (TW); Kuo-Sheng Chuang, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 15/471,170

(22) Filed: Mar. 28, 2017

(51) Int. Cl.
  *G03B 27/52* (2006.01)
  *G03B 27/62* (2006.01)
  *G03F 7/20* (2006.01)

(52) U.S. Cl.
  CPC ...... *G03F 7/70916* (2013.01); *G03F 7/70866* (2013.01); *G03F 7/70908* (2013.01); *G03F 7/70925* (2013.01)

(58) Field of Classification Search
  CPC ............ G03F 7/70866; G03F 7/70908; G03F 7/70916; G03F 7/70925

USPC ....................................................... 355/30, 75
See application file for complete search history.

(56) References Cited

U.S. PATENT DOCUMENTS

| 7,030,959 | B2 * | 4/2006 | Sogard | G03F 7/70875 34/403 |
| 2002/0096647 | A1 * | 7/2002 | Moors | G03F 7/70558 250/492.1 |
| 2007/0075276 | A1 * | 4/2007 | Nolscher | G03F 7/70916 250/504 R |
| 2012/0127446 | A1 * | 5/2012 | Oizumi | G03F 7/70916 355/67 |
| 2013/0235357 | A1 * | 9/2013 | Delgado | G03F 7/70908 355/30 |

* cited by examiner

*Primary Examiner* — Colin Kreutzer
(74) *Attorney, Agent, or Firm* — McClure, Qualey & Rodack, LLP

(57) ABSTRACT

An apparatus for a lithography device is provided, which includes a laser-based particle eliminating component and a particle collector. The laser-based particle eliminating component includes a laser emitter and a laser absorbing member. The laser emitter is configured to emit laser beams for irradiating particles in a space near a photomask of the lithography device. The laser absorbing member is disposed opposite to the laser emitter for absorbing the laser beams. The particle collector is configured for collecting the irradiated particles.

20 Claims, 7 Drawing Sheets

LITHOGRAPHY DEVICE AND APPARATUS AND METHOD FOR LITHOGRAPHY DEVICE

BACKGROUND

The semiconductor industry has experienced rapid growth in the past several decades. Technological advances in semiconductor materials and designs have produced increasingly smaller and more complex circuits. These semiconductor materials and designs become possible with the development of technologies related to processing and fabricating.

For fabrication of a semiconductor device, lithography processes are heavily relied, in which light of a particular wavelength is utilized to transfer a desired pattern onto a semiconductor wafer. For a lithography operation in a lithography device, in order to prevent particles from adhering to a photomask and therefore contaminating to a photomask of the lithography device, a pellicle is usually applied to lithography device to block particles from entering the photomask. However, for a conventional lithography device with a pellicle, a percentage of optical loss occurs during a lithography operation due to optical transmission through the pellicle. For example, the transmittance of a conventional pellicle is at most 90% for an extreme ultraviolet (eUV) light with a wavelength of 13.5 nm. Though the pellicle may be thinned for improving the optical efficiency of the lithography device, such thinned pellicle is fragile and hard to handle or clean. Furthermore, the high temperature of the internal lithography environment of a lithography device (such as an eUV lithography device) may cause the pellicle to become distorted, which adversely affects lithography accuracy and efficiency of the lithography device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
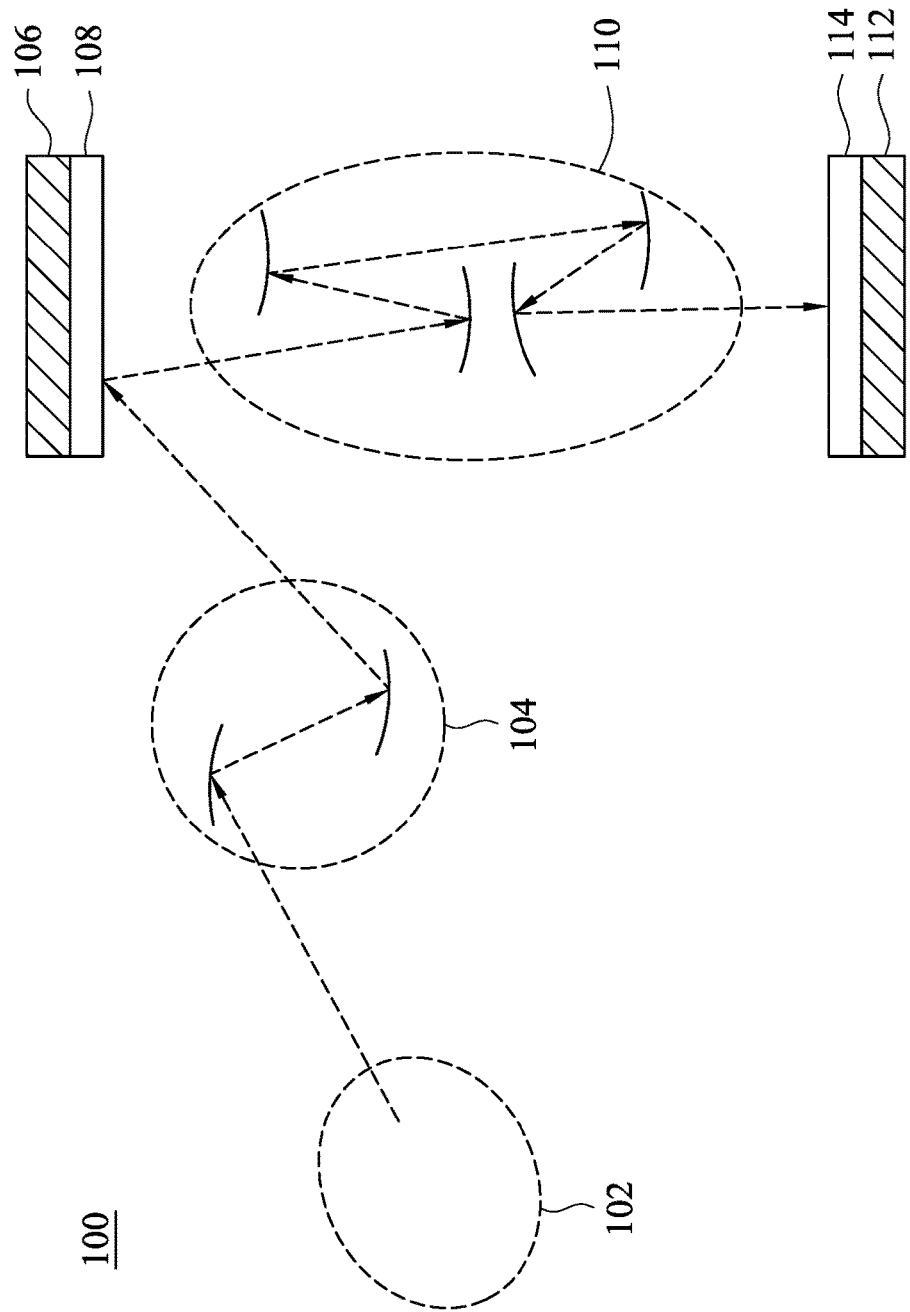
FIG. 1 is a schematic view of a lithography device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. In addition, the present disclosure may repeat reference numerals and/or letters in the various examples. This repetition is for the purpose of simplicity and clarity and does not in itself dictate a relationship between the various embodiments and/or configurations discussed. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly.

It will be understood that, although the terms "first", "second", etc., may be used in the claims to describe various elements, these elements should not be limited by these terms, and these elements correspondingly described in the embodiments are presented by different reference numbers. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

Embodiments of the present disclosure are directed to a lithography device and a particle removing apparatus and a particle removing method for a lithography device. By applying the particle removing apparatus and/or the particle removing method of the embodiments to a lithography device, a pellicle is not required to be disposed in the lithography device for blocking particles (or other contaminators such as ions) from adhering to a photomask of the lithography device, thereby avoiding at least issues related to pellicle distortion under a high temperature environment and optical loss due to transmission through a pellicle. Therefore, in addition to avoiding particles from contaminating a photomask, a lithography device with particle removing apparatus and/or the particle removing method of the embodiments also has at least advantages of no pellicle distortion issue and high optical efficiency.

Referring to FIG. 1, FIG. 1 is an exemplarily block diagram of a lithography device 100 in accordance with some embodiments of the present disclosure. The lithography device 100 includes a light source 102, an illuminator 104, a reticle stage 106 (with a photomask 108), projection optics 110 and a wafer stage 112. In various examples, each part of the lithography device 100 may be housed and operate in a high-vacuum environment to reduce atmospheric absorption of EUV light. In particular, the lithography device 100 may be a pellicle-free lithography device for improving light efficiency. That is, no pellicle is required to be applied in the lithography device 100.

The light source 102 may be any suitable light source, such as an ultraviolet (UV) light source, a deep UV (DUV) light source, an extreme UV (eUV) light source, an X-ray source, and another suitable light source. In some embodiments, the light source 102 includes a plasma source, for example, a discharge produced plasma (DPP) source, a laser produced plasma (LPP) source or another suitable plasma source. In some examples, the light source 102 may generate light with a wavelength ranging from about 1 nm to about 100 nm. In a particular example, the light source 102 generates eUV light with a wavelength of about 13.5 nm. In some embodiments, the radiation source (light source 102) also includes a collector, which may be used to collect the eUV light generated from the plasma source and to direct the eUV light toward optics such as the illuminator 104.

The illuminator 104 include optical components, such as a single mirror and a mirror system having multiple mirrors, in order to direct light from the light source 102 toward the reticle stage 106. The illuminator 104 may be configured to shape the light passing therethrough in accordance with a particular shape, such as a dipole shape, a quadrupole shape, an annular shape, a single beam shape, a multi-beam shape, combination thereof, and/or the like, and may be operated to configure its optical components to provide a desired illumination pattern to the wafer stage 112. In some embodiments, the illuminator 104 may further include a zone plate, in order to further improve focus of the light emitted from the light source 102.

The reticle stage 106 is configured to secure the photomask 108. In some embodiments, the lithography device 100 is an EUV lithographic device operating in a high-vacuum environment, and the reticle stage 106 may further include an electrostatic chuck (e-chuck) to secure the photomask 108. The photomask 108 may be a reflective type photomask or a transmissive type photomask, selectively allowing a portion of the light from the illuminator 104 to travel toward the projection optics 110 and absorbing the other portion of the light (i.e. blocking the other portion of the light from traveling toward the projection optics 110). In the case of reflective type, light is patterned and selectively reflected from the photomask 108 and is directed towards the projection optics 110. Oppositely, in the case of transmissive type, light is patterned and selectively passed from the photomask 108 and is directed towards the projection optics 110.

The projection optics 110 are configured to propagate the patterned light (i.e. patterned by the photomask 108) towards the wafer stage 112. The projection optics 110 may include refractive lenses, reflective mirrors, condensers, combinations thereof, or other suitable optical components, and may be operated to tune the reflective mirrors of the illuminator 104 for phase modulation.

The wafer stage 112 is configured to secure a semiconductor substrate 114 which is to be patterned under a lithographic operation of the lithography device 100. The semiconductor substrate 114 may be a semiconductor wafer, such as a silicon wafer, germanium wafer, silicon-germanium wafer, III-V wafer, or another suitable semiconductor wafer known in the art. The semiconductor substrate 114 may be coated with a photoresist layer sensitive to light (e.g., an eUV photoresist layer sensitive to eUV light). The wafer stage 112 is movable to allow various regions of the semiconductor substrate 114 to be stepped and scanned.

Figure 2:
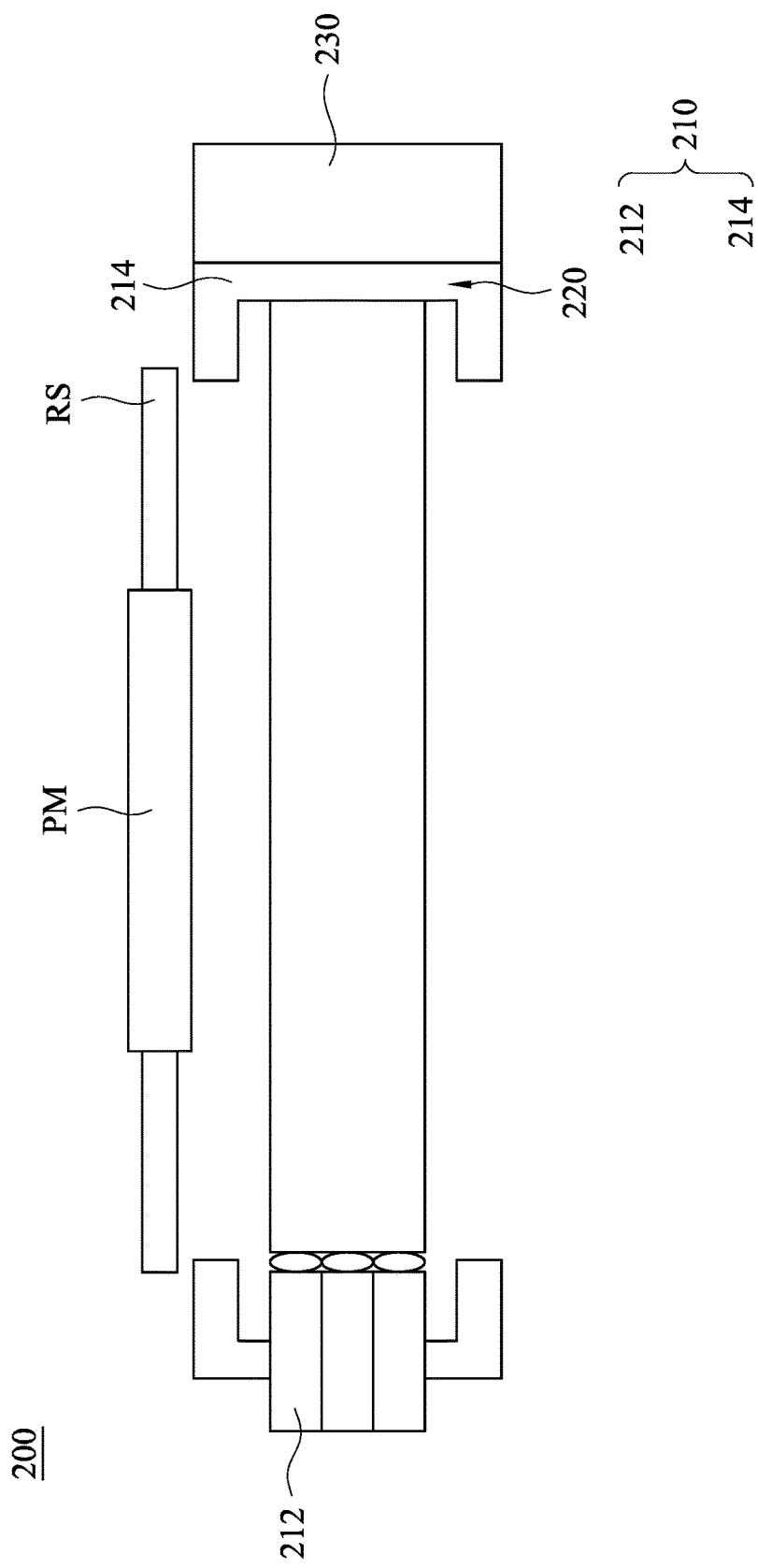
FIG. 2 is a schematic view of a particle removing apparatus for a lithography device in accordance with some embodiments of the present disclosure.

FIG. 2 is a schematic view of a particle removing apparatus 200 for a lithography device in accordance with some embodiments of the present disclosure. The particle removing apparatus 200 may be disposed in the lithography device 100 of FIG. 1 or another lithography device, such as an eUV lithography device, for removing particles in the interior thereof. As shown in FIG. 2, the particle removing apparatus 200 is disposed near a reticle stage RS which includes a photomask PM of reflective type or transmissive type. In the case of reflective type, the particle removing apparatus 200 is disposed at the front side (i.e. the light reflective side) of the photomask PM. Oppositely, in the case of transmissive type, the particle removing apparatus 200 may be disposed at the front side (i.e. the light receiving side) or the back side (i.e. the light emitting side) of the photomask PM. The particle removing apparatus 200 may be combined with the reticle stage RS to be an integrated apparatus. In other words, the particle removing apparatus 200 may be moved accompanying the movement of the reticle stage RS. In certain embodiments, the particle removing apparatus 200 is removably attached to the reticle stage RS. The particle removing apparatus 200 may be disposed in a space near a photomask of the lithography device (e.g. in a chamber including projection optics), and includes a laser-based particle eliminating component 210, a particle collector 220 and a cooler 230.

The laser-based particle eliminating component 210 is operated to irradiate particles (i.e., to burn out and/or charge the particles), which includes a laser emitter 212 and a laser absorbing member 214 respectively disposed at two opposite sides. The laser emitter 212 emits high-power laser beams toward the laser absorbing member 214 to form a shielding space S. The power of the laser beams emitted by the laser emitter 212 may be greater than 10 Watts (W), in order to burn out and/or charge the particles in the space near the photomask. In certain embodiments, the power of the laser beams emitted by the laser emitter 212 is greater than $10^3$ W. The length of the shielding space S (i.e. the distance between the laser emitter 212 and the laser absorbing member 214) may be set depending on the power of the laser beams, the length of the reticle stage RS/the photomask PM, the pressure of the space, and/or another factor.

The laser beams of the laser emitter 212 may be generated from light generated by a laser source of the lithography device. Specifically, the light source of the lithography device is operated to generate light; a portion of the light is transmitted to the laser emitter 212 for generating and emitting the laser beams, and the other portion of the light is used for a lithography operation on a semiconductor substrate.

Figure 3:
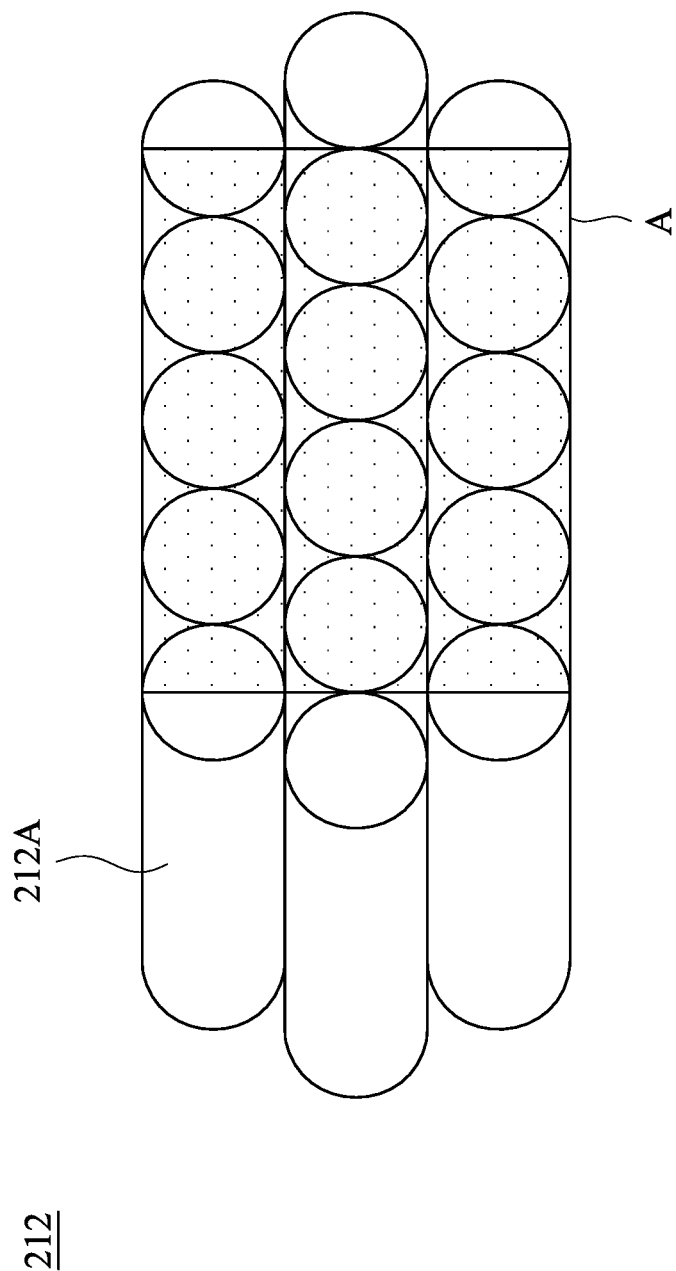
FIG. 3 is a schematic view of a laser emitter of FIG. 2.

In particular, as exemplarily illustrated in FIG. 3, the laser emitter 212 includes laser tubes 212A arranged in a hexagonal form, and an effective shielding area A (corresponding to the shielding space S of FIG. 2) is formed by such hexagonal form of the laser tubes 212A. Another arrangement may also or alternatively be deployed for the laser tubes 212A. The laser tubes 212A may emit the laser beams of the same power or different powers. The area of the effective shielding area A may be configured depending on the power of the laser beams, the width of the reticle stage RS/the photomask PM, and/or another factor.

The laser absorbing member 214 is used to absorb the laser beams emitted by the laser emitter 212, in order to avoid the laser beams from damaging another component disposed in the lithography device. The laser absorbing member 214 may convert the energy of the laser beams generated by the laser emitter 212 into heat. The laser absorbing member 214 may include a material with high melting point and/or high laser absorption rate, such as ceramics, carbon, amorphous carbon, platinum, and/or another suitable material.

The particle collector 220 is operated to collect the particles irradiated in the shielding space S. The particle collector 220 may include a static charge particle collector, an ion collector, a vacuum pump, combinations thereof, and/or another component suitable for collecting the irradiated particles. In some embodiments, as shown in FIG. 2, the particle collector 220 is disposed combined with the laser absorbing member 214, and therefore the collecting operation and the laser absorbing operation are performed at the same place of the lithography device. In some embodiments, the particle collector 220 may be alternatively disposed between the laser absorbing member 214 and the reticle stage RS. In certain embodiments, the particle collector 220 is a vacuum pump operating at a pressure of about or less than $10^{-5}$ Torr.

The cooler 230 is disposed against the laser absorbing member 214 for conducting the heat of the laser absorbing member 214. The cooler 230 may include a material with high thermal conductivity, such as silver, copper, gold, aluminum, combinations thereof, and/or another suitable material. In certain embodiments, a liquid cooling system may be deployed as the cooler 230 or a part of the cooler 230.

Figure 4:
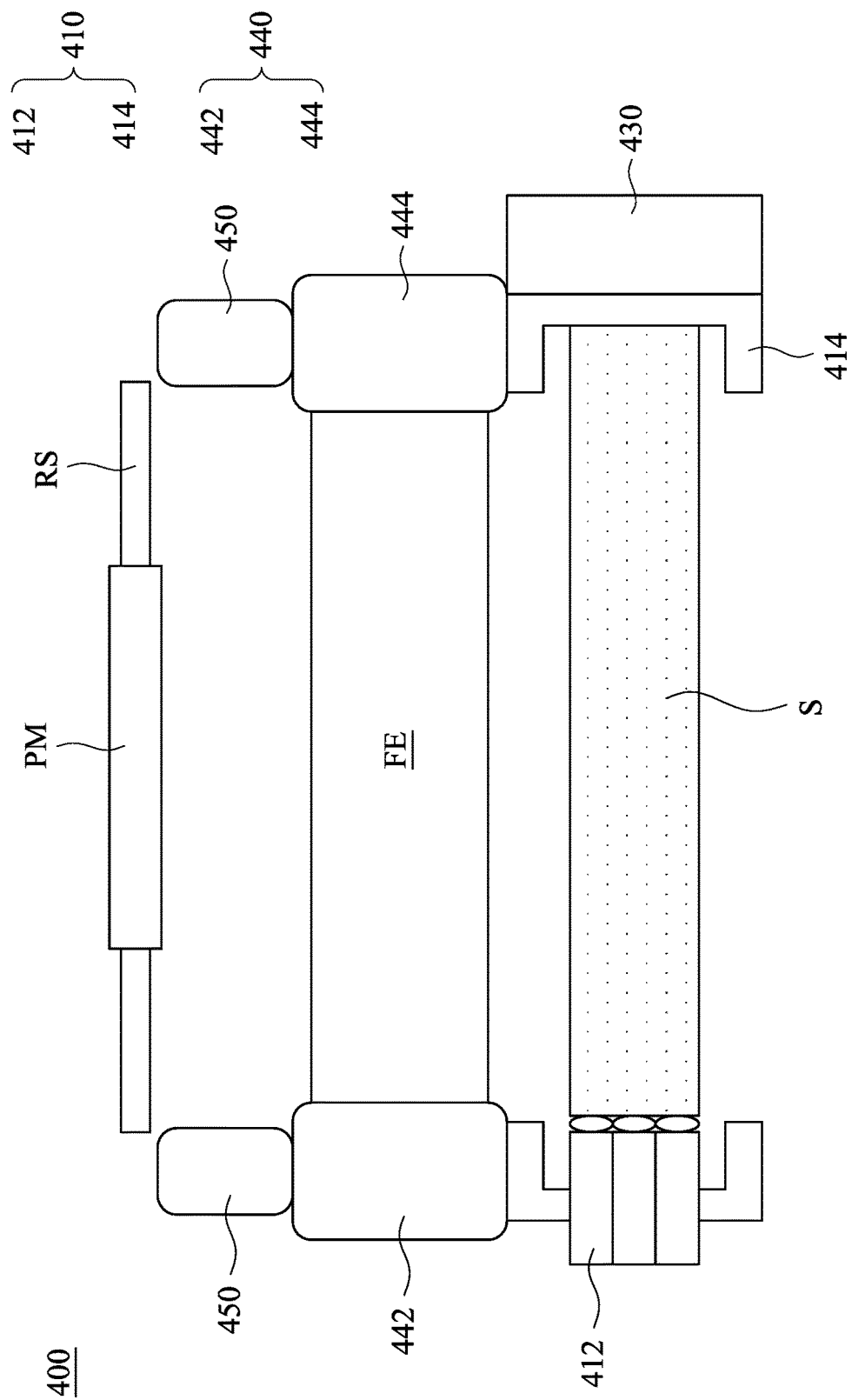
FIG. 4 is a schematic view of a particle removing apparatus for a lithography device in accordance with some embodiments of the present disclosure.

FIG. 4 is a schematic view of a particle removing apparatus 400 for a lithography device in accordance with some embodiments of the present disclosure. The particle removing apparatus 400 may be disposed in the lithography device 100 of FIG. 1 or another lithography device, such as an eUV lithography device, for removing particles in the interior thereof. In particular, the particle removing apparatus 400 may be disposed in a space near a photomask of the lithography device (e.g. in a chamber including projection optics). As shown in FIG. 4, the particle removing apparatus 400 is disposed near a reticle stage RS which includes a photomask PM of reflective type or transmissive type. In the case of reflective type, the particle removing apparatus 400 is disposed at the front side (i.e. the light reflective side) of the photomask PM. Oppositely, in the case of transmissive type, the particle removing apparatus 400 may be disposed at the front side (i.e. the light receiving side) or the back side (i.e. the light emitting side) of the photomask PM. The particle removing apparatus 400 may be combined with the reticle stage RS to be an integrated apparatus. In other words, the particle removing apparatus 400 may be moved accompanying the movement of the reticle stage RS. In certain embodiments, the particle removing apparatus 400 is removably attached to the reticle stage RS. The particle removing apparatus 400 includes a laser-based particle eliminating component 410, a cooler 430, a force field generator 440 and a particle collector 450, among which the particle collector 450 and the laser-based particle eliminating component 410 are disposed nearest to and farthest to the reticle stage RS, respectively.

The laser-based particle eliminating component 410 is operated to irradiate particles (i.e., to burn out and/or charge the particles) and includes a laser emitter 412 and a laser absorbing member 414 respectively disposed at two opposite sides. The laser emitter 412 emits high-power laser beams toward the laser absorbing member 414 to form a shielding space S. The power of the laser beams emitted by the laser emitter 412 may be greater than 10 W, in order to burn out and/or charge the particles in the space near the photomask. In certain embodiments, the power of the laser beams emitted by the laser emitter 412 is greater than $10^3$ W. The length of the shielding space S (i.e. the distance between the laser emitter 412 and the laser absorbing member 414) may be configured depending on the power of the laser beams, the length of the reticle stage RS/the photomask PM, the pressure of the space, the distance between the laser-based particle eliminating component 410 and the reticle stage RS/the photomask PM, and/or another factor.

The laser beams of the laser emitter 412 may be generated from light generated by a laser source of the lithography device. Specifically, the light source of the lithography device is operated to generate light; a portion of the light is transmitted to the laser emitter 412 for generating and emitting the laser beams, and the other portion of the light is used for a lithography operation on a semiconductor substrate. The laser emitter 412 includes laser tubes, which may be similar to the laser tubes 212A shown in FIG. 3. The laser tubes of the laser emitter 412 may emit the laser beams of the same power or different powers. The area of an effective shielding area of the laser emitter 412 (corresponding to the shielding space S) may be configured depending on the power of the laser beams, the width of the reticle stage RS/the photomask PM, and/or another factor.

The laser absorbing member 414 is used to absorb the laser beams emitted by the laser emitter 412, in order to avoid the laser beams from damaging another component disposed in the lithography device. The laser absorbing member 414 may convert the energy of the laser beams generated by the laser emitter 412 into heat. The laser absorbing member 414 may include a material with high melting point and/or high laser absorption rate, such as ceramics, carbon, amorphous carbon, platinum, and/or another suitable material.

The cooler 430 is disposed against the laser absorbing member 414 for conducting the heat of the laser absorbing member 414. The cooler 430 may include a material with high thermal conductivity, such as silver, copper, gold, aluminum, combinations thereof, and/or another suitable material. In certain embodiments, a liquid cooling system may be deployed as the cooler 430 or a part of the cooler 430.

The force field generator 440 is disposed between the laser-based particle eliminating component 410 and the reticle stage RS for attracting the particles irradiated in the shielding space S. The force field generator 440 includes a first member 442 and a second member 444 disposed at two opposite sides. The first member 442 and the second member 444 are operated collectively to generate a force field FE, which may be an electric field, a magnetic field or an electromagnetic field. A charged particle or ion from the shielding space S to the photomask PM experience a Lorentz force in the force field FE, and therefore the moving of the charged particle or ion is affected by the force field FE. In some exemplarily examples, the first member 442 and the second member 444 may be electrode plates which respectively have a high voltage potential and a low voltage potential (or a low voltage potential and a high voltage potential). In other exemplarily examples, the first member 442 and the second member 444 may respectively be a north pole and a south pole (or a south pole and a north pole). In certain exemplarily examples, the first member 442 and the second member 444 may be an electrode plate pair or a magnetic pole pair, and the force field generator 440 further includes an extra magnetic pole pair or an extra electrode plate pair disposed at another two relative sides perpendicular to the sides corresponding to the first member 442 and the second member 444, so as to generate the force field FE as an electromagnetic field.

The magnitude of the force field FE may be set depending on the height of the force field generator 440, the distance between the force field generator 440 and the reticle stage RS/the photomask PM, the size of the photomask PM, and/or another factor. In the case of electric field or electromagnetic field, the height of the force field generator 440 and the distance between the force field generator 440 and the reticle stage RS may be about 5 cm and about 10 cm, respectively, and the electric field magnitude of the force field FE may be correspondingly determined from about $10^3$ Volts per meter (V/m) to about $10^4$ V/m.

The particle collector 450 is operated to collect the particles irradiated in the shielding space S. The particle collector 450 may include a static charge particle collector, an ion collector, a vacuum pump, combinations thereof, and/or another component suitable for collecting the irradiated particles passing through the force field FE. In certain embodiments, the particle collector 450 is a vacuum pump operating at a pressure of about or less than $10^{-5}$ Torr.

Figure 5:
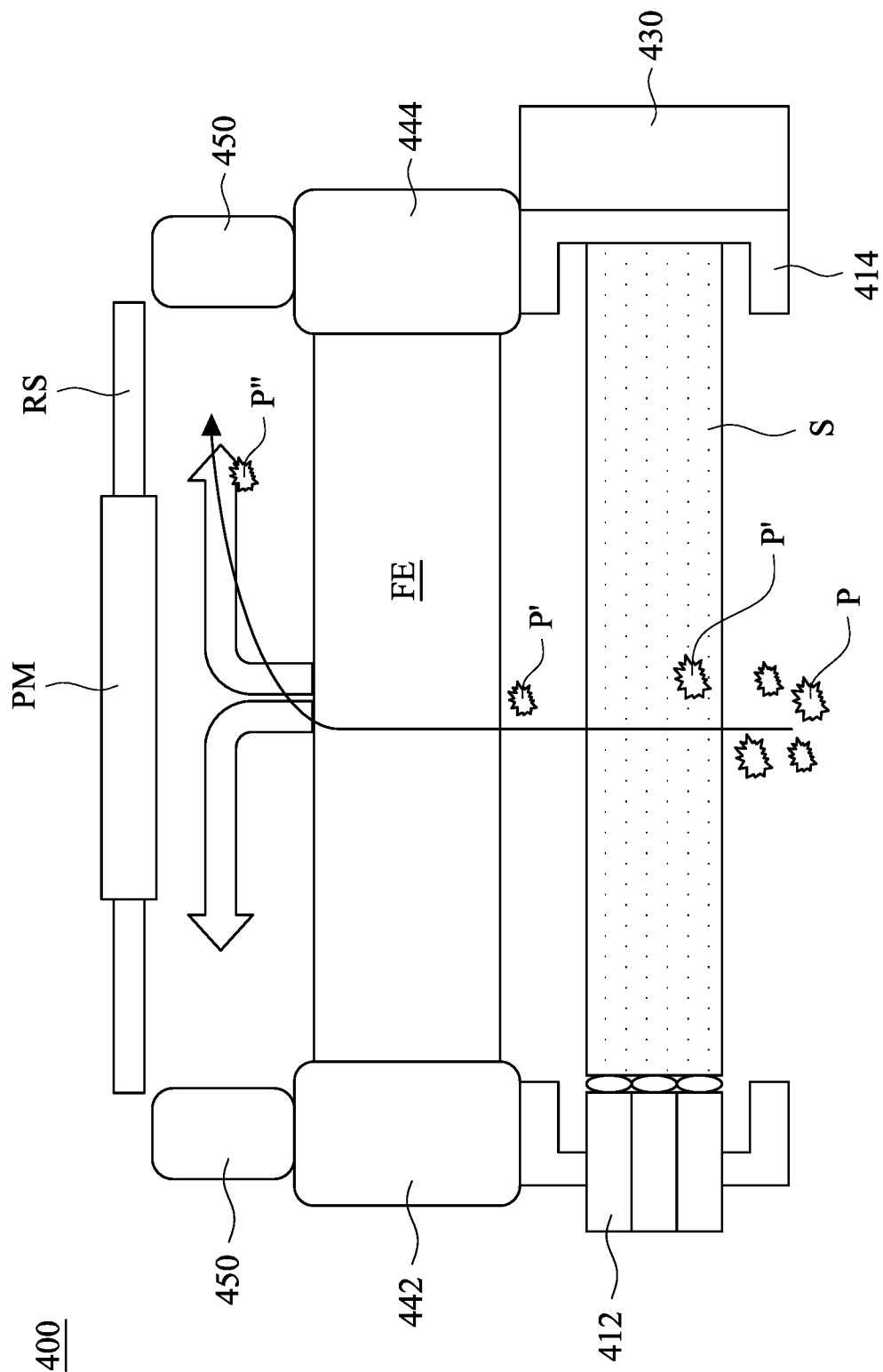
FIG. 5 is a schematic view exemplarily illustrating removal of particles by the particle removing apparatus of FIG. 4.

FIG. 5 exemplarily illustrates removal of particles by the particle removing apparatus 400 for a lithography device. In the direction D towards the photomask PM, particles P firstly enter the shielding space S. In the shielding space S, the particles P are irradiated by the lease beams generated from the laser emitter 412. Under the irradiation of the laser beams, the particles P may be charged or carbonized (denoted as particles P').

The particles P' subsequently enter into the force field FE (e.g. an electric field, a magnetic field or an electromagnetic field). The moving direction of each of the particles P' is affected by the Lorentz force in the force field FE. For example, if the first member 442 and the second member 444 are two electrode plates with a high voltage potential and a low voltage potential, respectively, the moving directions of the particles P' with positive charge are tilted to the side of second member 444 by the effect of the Lorentz force (the tilted particles P' are denoted as particles P").

After passing through the force field FE, the particles P" are collected by the particle collector 450 instead of traveling to the photomask PM. As such, the particle removing apparatus 400 blocks the particles P from entering to the photomask PM even if no pellicle is disposed in the lithography device.

Figure 6:
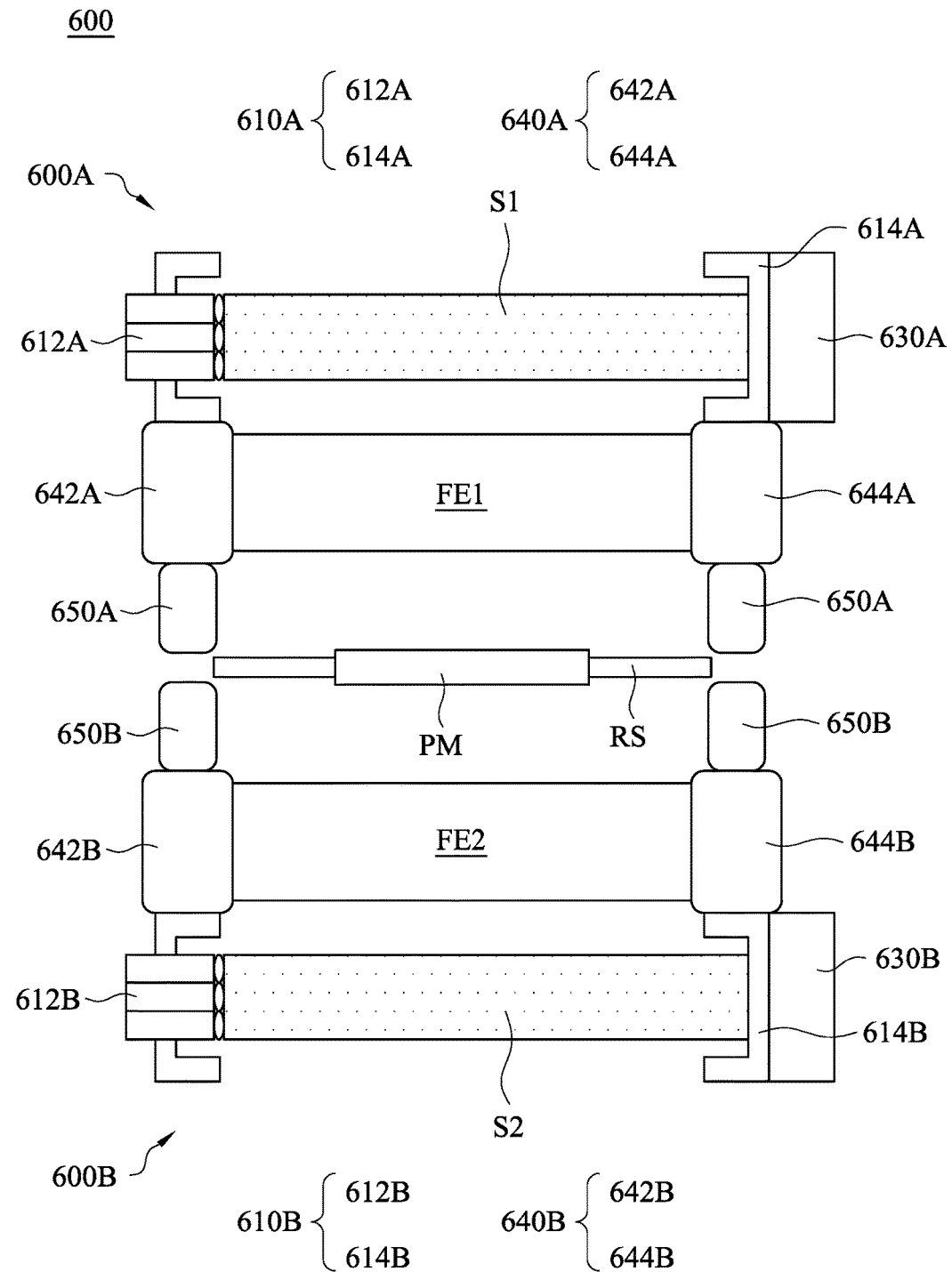
FIG. 6 is a schematic view of a particle removing apparatus for a lithography device in accordance with some embodiments of the present disclosure.

FIG. 6 is a schematic view of a particle removing apparatus 600 for a lithography device in accordance with some embodiments of the present disclosure. The particle removing apparatus 600 may be disposed in the lithography device 100 of FIG. 1 or another lithography device, such as an eUV lithography device, for removing particles in the interior thereof. In particular, the particle removing apparatus 600 may be disposed in a space near a photomask of the lithography device (e.g. in a chamber including projection optics). As shown in FIG. 6, the particle removing apparatus 600 has two portions 600A and 600B, which are disposed near two opposite sides of a reticle stage RS (which includes a photomask PM of transmissive type), respectively; the portion 600A is disposed at the front side (i.e. the light receiving side) of the photomask PM, while the portion 600B is disposed at the back side (i.e. the light emitting side) of the photomask PM.

The portion 600A of particle removing apparatus 600 includes a laser-based particle eliminating component 610A (which includes a laser emitter 612A and a laser absorbing member 614A for establishing a shielding space S1 therebetween), a cooler 630A, a force field generator 640A (which includes a first member 642A and a second member 644A for establishing a force field FE1 therebetween) and a particle collector 650A, among which the particle collector 650A and the laser-based particle eliminating component 610A are disposed nearest to and farthest to the reticle stage RS, respectively. Similarly, the portion 600B of particle removing apparatus 600 includes a laser-based particle eliminating component 610B (which includes a laser emitter 612B and a laser absorbing member 614B for establishing a shielding space S2 therebetween), a cooler 630B, a force field generator 640B (which includes a first member 642B and a second member 644B for establishing a force field FE2 therebetween) and a particle collector 650B, among which the particle collector 650B and the laser-based particle eliminating component 610B are disposed nearest to and farthest to the reticle stage RS, respectively. The laser-based particle eliminating components 610A and 610B, the coolers 630A and 630B, the force field generators 640A and 640B and the particle collectors 650A and 650B of the particle removing apparatus 600 are similar to the laser emitter 412, the laser absorbing member 414, the cooler 430, the force field generator 440 and the particle collector 450 of the particle removing apparatus 400, and the details are not repeated herein.

The portions 600A and 600B of the particle removing apparatus 600 may be independent. For illustration, the portion 600B of the particle removing apparatus 600 may be moved accompanying the movement of the reticle stage RS, while the position of the portion 600A of the particle removing apparatus 600 in the lithography device may be fixed. In addition, the magnitudes of the force fields FE1 and FE2 and the powers of the laser beams in the shielding fields S1 and S2 may be set depending on various operative requirements.

Figure 7:
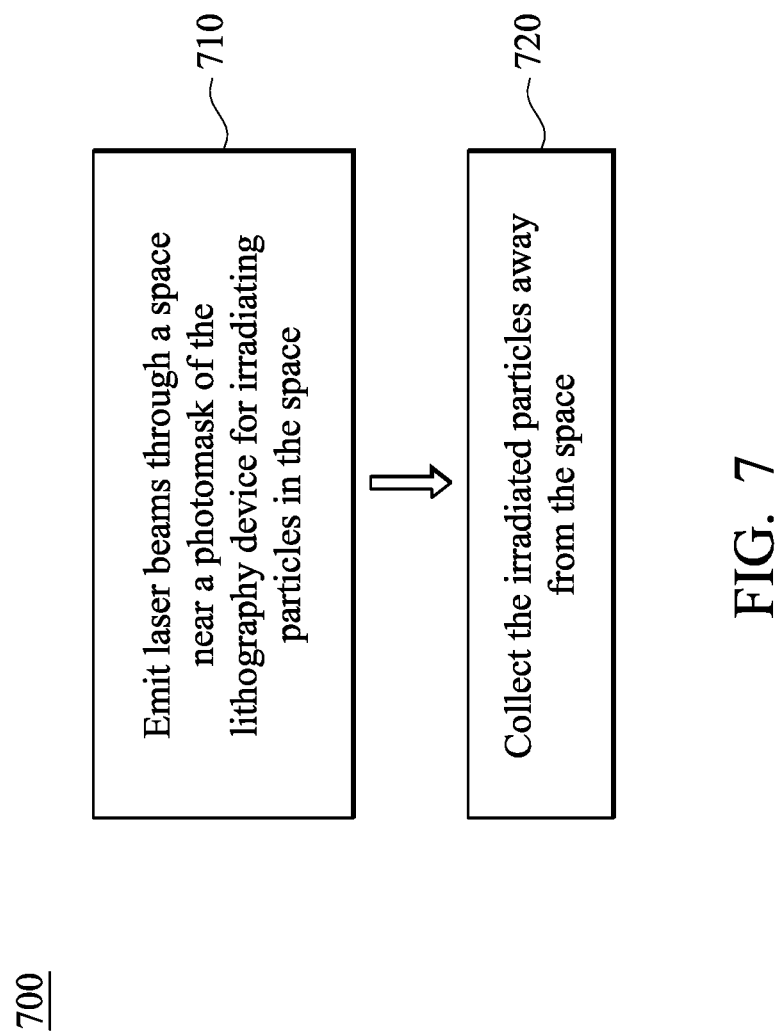
FIG. 7 is a flowchart of a particle removing method for a lithography device in accordance with some embodiments of the present disclosure.

FIG. 7 is a flowchart of a particle removing method 700 for a lithography device in accordance with some embodiments of the present disclosure. The particle removing method 700 may be performed in the lithography device 100 of FIG. 1 or another lithography device. Further, the particle removing method 700 may be performed by utilizing the particle removing apparatus 200 of FIG. 2, the particle removing apparatus 400 of FIG. 4, the particle removing apparatus 600 of FIG. 6, or the like. The particle removing method 700 begins at operation 710, where laser beams are emitted through a space near a photomask of the lithography device for irradiating particles in the space. The power of the laser beams may be set depending on various operative requirements. In some embodiments, the laser beams are emitted having a power of substantially greater than 10 W.

The particle removing method 700 next proceeds to operation 720, where the irradiated particles are collected away from the space. The irradiated particles may be collected by utilizing a static charge particle collector, an ion collector, a vacuum pump, combinations thereof, and/or another component suitable for collecting the irradiated particles. A force field may be generated in the lithography device for attracting the particles the particles irradiated at operation 710 before collecting the irradiated particles away from the space. The applied force field may be an electric field, a magnetic field or an electromagnetic field. The magnitude of the force field may be set depending on various operative requirements. For example, in the case of electric field, the force field may be generated with a magnetic of $10^3$ V/m to $10^4$ V/m.

By applying the particle removing apparatus and/or the particle removing method of the embodiments to a lithography device, a pellicle is not required for blocking particles from adhering to a photomask in the lithography device. As such, at least issues related to pellicle distortion under a high temperature environment and optical loss due to transmission through a pellicle are avoided. Further, the laser power and the magnitude of the force field of the particle removing apparatus and/or the particle removing method of the embodiments may be set depending on various operative requirements. Consequently, a lithography device with particle removing apparatus and/or the particle removing method of the embodiments has at least advantages of no pellicle distortion issue, high optical efficiency and easy configuration for various operative requirements.

In accordance with some embodiments, an apparatus for a lithography device includes a laser-based particle eliminating component and a particle collector. The laser-based particle eliminating component includes a laser emitter and a laser absorbing member. The laser emitter is configured to emit laser beams for irradiating particles in a space near a photomask of the lithography device. The laser absorbing member is disposed opposite to the laser emitter for absorbing the laser beams. The particle collector is configured for collecting the irradiated particles.

In accordance with certain embodiments, a lithography device includes a reticle stage and a particle removing apparatus. The reticle stage has a photomask. The particle removing apparatus is disposed near the photomask and includes a laser-based particle eliminating component and a particle collector. The laser-based particle eliminating component includes a laser emitter and a laser absorbing member. The laser emitter is configured to emit laser beams for irradiating particles in a space near the photomask. The laser absorbing member is disposed opposite to the laser for absorbing the laser beams. The particle collector is configured for collecting the irradiated particles.

In accordance with some embodiments, a method for a lithography device includes the following steps. Laser beams are emitted through a space near a photomask of the lithography device for irradiating particles in the space. The irradiated particles are collected away from the space.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus for a lithography device, the apparatus comprising:
   a laser-based particle eliminating component, comprising:
      a laser emitter configured to emit laser beams for irradiating particles in a space near a photomask of the lithography device; and
      a laser absorbing member disposed opposite to the laser emitter for absorbing the laser beams;
   a particle collector for collecting the irradiated particles; and
   a laser source configured to generate light, wherein a first portion of the light is transmitted to the laser emitter for emitting the laser beams, and a second portion of the light is used for generating extreme ultraviolet (eUV) light for a process of the lithography device.

2. The apparatus of claim 1, wherein a power of the laser beams emitted by the laser emitter is substantially greater than 10 Watts (W).

3. The apparatus of claim 1, further comprising:
   a cooler disposed against the laser absorbing member for cooling the laser absorbing member.

4. The apparatus of claim 1, further comprising:
   a force field generator disposed between the particle collector and the laser-based particle eliminating component for attracting the irradiated particles.

5. The apparatus of claim 4, wherein a magnitude of an electric field generated by the force field generator is substantially from $10^3$ Volts per meter (V/m) to $10^4$ V/m.

6. The apparatus of claim 1, wherein the particle collector comprises a static charge particle collector, an ion collector or a vacuum pump.

7. The apparatus of claim 1, wherein the particle collector is disposed in conjunction with the laser absorbing member.

8. A lithography device, comprising:
   a reticle stage having a photomask;
   a particle removing apparatus disposed near the photomask, the particle removing apparatus comprising:
      a laser-based particle eliminating component comprising:
         a laser emitter configured to emit laser beams for irradiating particles in a space near the photomask; and
         a laser absorbing member disposed opposite to the laser emitter for absorbing the laser beams; and
      a particle collector for collecting the irradiated particles; and
   a laser source configured to generate light, wherein a first portion of the light is transmitted to the laser emitter for emitting the laser beams, and a second portion of the light is used for generating extreme ultraviolet (eUV) light for a process of the lithography device.

9. The lithography device of claim 8, wherein a power of the laser beams emitted by the laser emitter is substantially greater than 10 W.

10. The lithography device of claim 8, wherein the particle removing apparatus further comprises:
    a cooler disposed against the laser absorbing member for cooling the laser absorbing member.

11. The lithography device of claim 8, wherein the particle removing apparatus further comprises:
    a force field generator disposed between the particle collector and the laser-based particle eliminating component for attracting the irradiated particles.

12. The lithography device of claim 11, wherein a magnitude of an electric field generated by the force field generator is substantially from $10^3$ V/m to $10^4$ V/m.

13. The lithography device of claim 8, wherein the particle collector comprises a static charge particle collector, an ion collector or a vacuum pump.

14. The lithography device of claim 8, wherein the particle collector is disposed in conjunction with the laser absorbing member.

15. The lithography device of claim 8, wherein the particle removing apparatus is removably attached to the reticle stage.

16. A method for a lithography device, the method comprising:

generating light by a laser source;
using a first portion of the light to emit laser beams through a space near a photomask of the lithography device for irradiating particles in the space;
collecting the irradiated particles away from the space; and
using a second portion of the light to generate extreme ultraviolet (eUV) light for a process of the lithography device.

17. The method of claim 16, wherein the laser beams are emitted having a power of substantially greater than 10 Watts (W).

18. The method of claim 16, further comprising:
generating a force field in the space for attracting the irradiated particles away from the space.

19. The method of claim 18, wherein the force field is generated having an electric field with a magnitude of substantially from $10^3$ V/m to $10^4$ V/m.

20. The apparatus of claim 3, wherein the cooler comprises a liquid cooling system.

* * * * *